United States Patent [19]

Tago

[11] Patent Number: 5,233,234
[45] Date of Patent: Aug. 3, 1993

[54] EMITTER FOLLOWER OUTPUT CIRCUIT

[75] Inventor: Shusei Tago, Tokyo, Japan

[73] Assignee: NEC Corporation, Tokyo, Japan

[21] Appl. No.: 748,622

[22] Filed: Aug. 22, 1991

[30] Foreign Application Priority Data

Aug. 22, 1990 [JP] Japan .................. 2-220203

[51] Int. Cl.⁵ .......................... H03K 19/06
[52] U.S. Cl. ...................... 307/254; 307/455; 307/296.1; 307/296.6; 307/248
[58] Field of Search ............ 307/254, 455, 296.1, 307/296.6, 455, 248

[56] References Cited

U.S. PATENT DOCUMENTS

| | | | |
|---|---|---|---|
| 3,781,689 | 12/1973 | Marshall et al. | 307/254 |
| 4,331,887 | 5/1982 | Jadus et al. | 307/254 |
| 4,623,803 | 11/1986 | Thompson et al. | 307/254 |
| 4,672,242 | 6/1987 | Teymouri | 307/254 |
| 4,827,158 | 5/1989 | Matsumura | 307/455 |
| 4,835,455 | 5/1989 | Coddington et al. | 307/455 |
| 4,926,065 | 5/1990 | Coy et al. | 307/455 |
| 5,059,827 | 10/1991 | Phan et al. | 307/455 |

FOREIGN PATENT DOCUMENTS

| | | |
|---|---|---|
| 0317271 | 5/1989 | European Pat. Off. . |
| 423940 | 4/1991 | European Pat. Off. . |
| 2641143 | 6/1990 | France . |
| 1190021 | 7/1989 | Japan . |
| 8601055 | 2/1986 | World Int. Prop. O. . |

Primary Examiner—William L. Sikes
Assistant Examiner—Scott A. Ouellette

[57] ABSTRACT

An emitter follower output circuit includes a first bipolar transistor for outputting a potential from its emitter to an output terminal and a second bipolar transistor, connected in series to the first bipolar transistor, for feeding a current to the first bipolar transistor. A capacitor connected between a collector of the first bipolar transistor and a base of the second bipolar transistor detects a transitional change of a potential at the collector of the first bipolar transistor and controls a potential at the base of the second bipolar transistor. The current flowing into the emitter follower output circuit is made small independently of the potential level of the output terminal in the steady-states, the current is made large transitionally and correspondingly to the degree of the load capacitance so as to discharge the load capacitance rapidly in the falling period of the output signal, and the current is made small transitionally so as to charge the load capacitance rapidly by use of the output transistor, whereby it is possible to provide an emitter follower output circuit which consumes little power and which operates at a high speed.

4 Claims, 5 Drawing Sheets

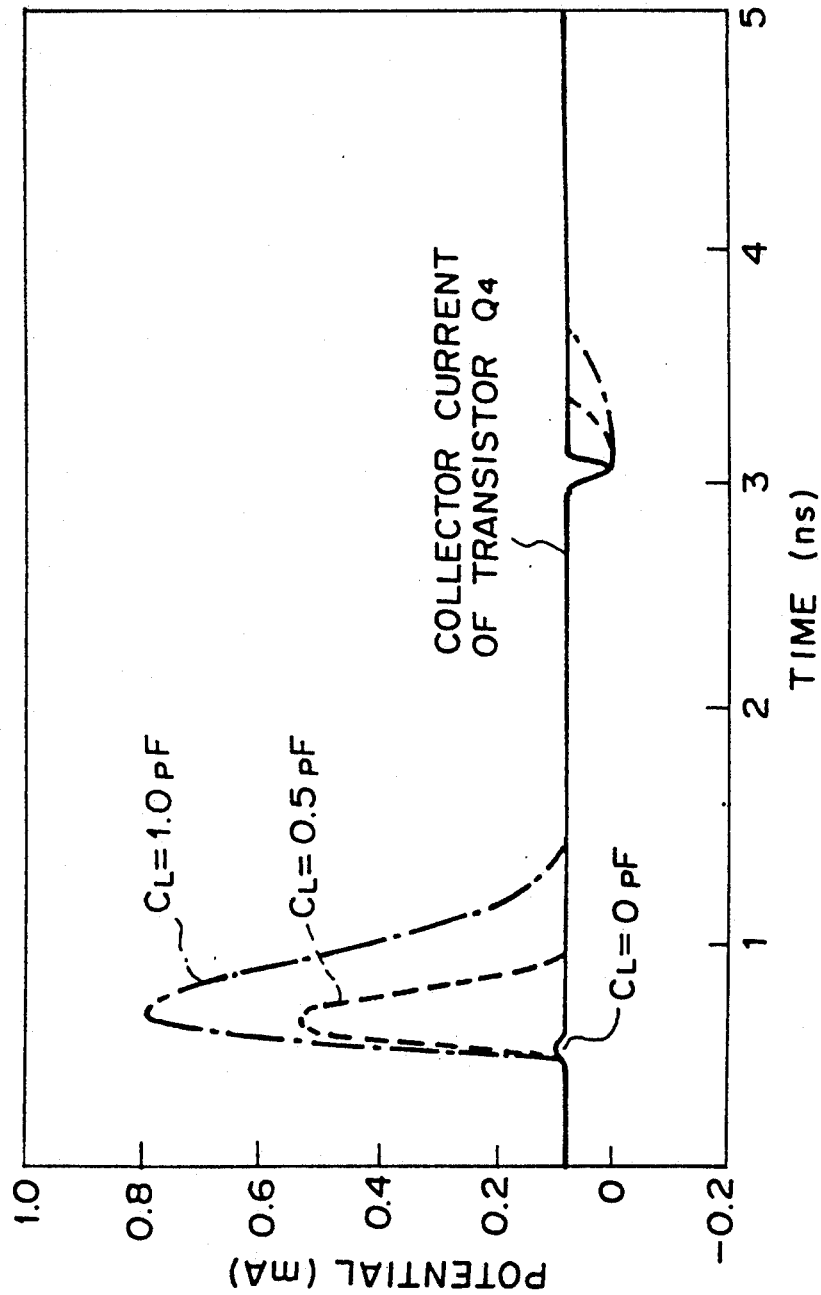

EMITTER FOLLOWER OUTPUT CIRCUIT

BACKGROUND OF THE INVENTION

The present invention relates to an output circuit of a logic circuit and, more particularly, to a circuit configuration of an emitter follower output circuit.

Generally, an emitter follower circuit of this kind is often used as an output circuit connected to the output side of a differential logic circuit constituted by a pair of differential transistors, so as to drive a load connected to a next stage.

In the following description, a circuit having such a combination of a differential logic circuit and an emitter follower output circuit as mentioned above will be referred to as an "ECL (Emitter Coupled Logic) circuit".

FIG. 1 shows a circuit diagram of an inverter circuit as an example of an ECL circuit using a conventional emitter follower output circuit.

This inverter circuit is constituted by a differential logic circuit 1 and an emitter follower output circuit 2.

The differential logic circuit 1 is basically constituted by a differential pair configuration of two NPN bipolar transistors $Q_1$ and $Q_2$. The NPN bipolar transistor $Q_1$ has a base connected to an input terminal 3 and a collector connected to a higher potential power supply terminal 4 through a serially connected resistors $R_1$ and $R_2$. This transistor $Q_1$ operates as an input transistor. The NPN bipolar transistor $Q_2$ has a base connected to a reference potential supply terminal 5, and a collector connected to the higher potential power supply terminal 4 through the resistor $R_2$. Emitters of the above two transistors $Q_1$ and $Q_2$ are connected together and commonly connected to a first lower potential power supply terminal 7 through a constant current source 6.

The emitter follower output circuit 2 is constituted by a constant current source 8 and an NPN bipolar transistor $Q_3$ which operates as an output transistor. The NPN bipolar transistor $Q_3$ has a collector connected directly to the higher potential power supply terminal 4, and an emitter connected to a second lower potential power supply terminal 9 through the constant current source 8.

An output signal from the differential logic circuit 1 is supplied to a base of the output NPN bipolar transistor $Q_3$, and an output signal of the inverter circuit as a whole is outputted through an output terminal 10 connected to the emitter of the NPN bipolar transistor $Q_3$.

A capacitor $C_L$ connected to the emitter of the output NPN bipolar transistor $Q_3$ represents a capacitance acting as a load and including a wiring capacitance and a junction or coupling capacitance.

In the inverter circuit having such a configuration as described above, when a signal applied to the input terminal 3 has a high level potential, the NPN bipolar transistor $Q_1$ becomes conductive, while the NPN bipolar transistor $Q_2$ becomes non-conductive.

At this time, an output signal having a low level potential is outputted from the output terminal 10. This low level potential has a value obtained by subtracting, from the potential at the higher potential power supply terminal 4, the sum of the voltage drop across the series connection of the resistors $R_1$ and $R_2$ due to a current flowing through the constant current source 6 and the forward voltage across the base-emitter circuit of the output NPN bipolar transistor $Q_3$.

Next, when the signal applied to the input terminal 3 has a low level potential, on the contrary, the input NPN bipolar transistor $Q_1$ becomes non-conductive, and the NPN bipolar transistor $Q_2$ becomes conductive.

At this time, therefore, the output signal outputted to the output terminal 10 has a high level potential. This high level potential has a value obtained by subtracting, from the potential at the higher potential power supply terminal 4, the sum of the voltage drop across the resistor $R_2$ and the base-emitter forward voltage of the output NPN bipolar transistor $Q_3$.

As described above, there generally exists in the ECL circuit a load capacitance $C_L$ at the output terminal 10 composed of wiring capacitances and junction capacitances of the output transistor $Q_3$ and the constant current source 8.

Accordingly, there occurs charging/discharging of the load capacitance $C_L$ at the leading/trailing edge portions of the output signal.

Consideration is made on the ECL circuit using such a conventional emitter follower output circuit with respect to the charging/discharging of the load capacitance $C_L$ at the leading/trailing edge portions of the output signal.

In this case, at the leading edge portion of the output signal, the load capacitance $C_L$ is charged by a driving current flowing into the load capacitance $C_L$ from the output NPN bipolar transistor $Q_3$. However, the driving capability of the transistor $Q_3$ is so large that a sufficiently high response speed is obtained. Accordingly, there generates no problem irrespective of the current value of the constant current source 8.

At the trailing edge portion of the output signal, on the other hand, the load capacitance $C_L$ is discharged by the constant current source 8.

In order to make the response speed of the circuit high, it is therefore necessary to increase the current value of the constant current source 8.

Recently, integrated circuits have been made largescaled so that the length of wiring becomes long to allow the load capacitance $C_L$ to become larger and larger. On the other hand, it is impossible to increase the current value of the constant current source correspondingly to the increase in the length of wiring, from the requirement of preventing an increase in power consumption. In the conventional emitter follower output circuit, therefore, there occurs a problem that the trailing time of the output signal becomes extremely long.

SUMMARY OF THE INVENTION

It is, therefore, an object of the invention to solve the aforementioned problems existing in the conventional circuits.

It is another object of the invention to provide an emitter follower output circuit which consumes little power and which operates at a high speed.

According to one aspect of the invention, there is provided an emitter follower output circuit comprising:
a first bipolar transistor for feeding a potential from its emitter to an output terminal;
a second bipolar transistor which is connected in series to the first bipolar transistor and feeds a current to the first bipolar transistor; and
a control means which is connected between a collector of the first bipolar transistor and a base of the second bipolar transistor, which detects a transitional change of a potential at the collector of the first bipolar transistor and which controls a potential at the base of the second bipolar transistor;

whereby the current flowing into the second bipolar transistor becomes transitionally larger than the current value in a steady-state when an output signal falls, and becomes transitionally smaller than the current value in the steady-state when the output signal rises.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 3A and 3B are graphs showing signal waveforms at the time of operation of the first embodiment.

PREFERRED EMBODIMENTS OF THE INVENTION

Figure 1:
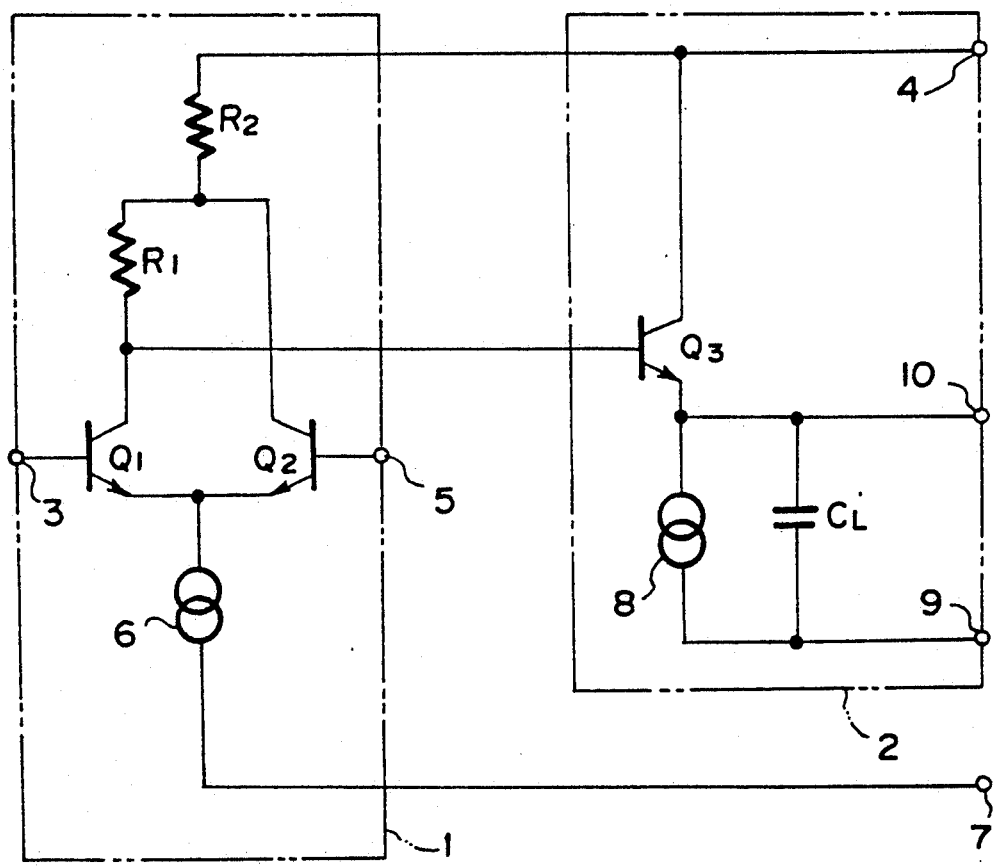
FIG. 1 is a circuit diagram showing the circuit configuration of a conventional emitter follower output circuit.

Referring to the drawings, preferred embodiments of the present invention will now be described hereunder.

Throughout the following explanation, the same reference numerals refer to the same or like elements in all the drawings.

Figure 2:
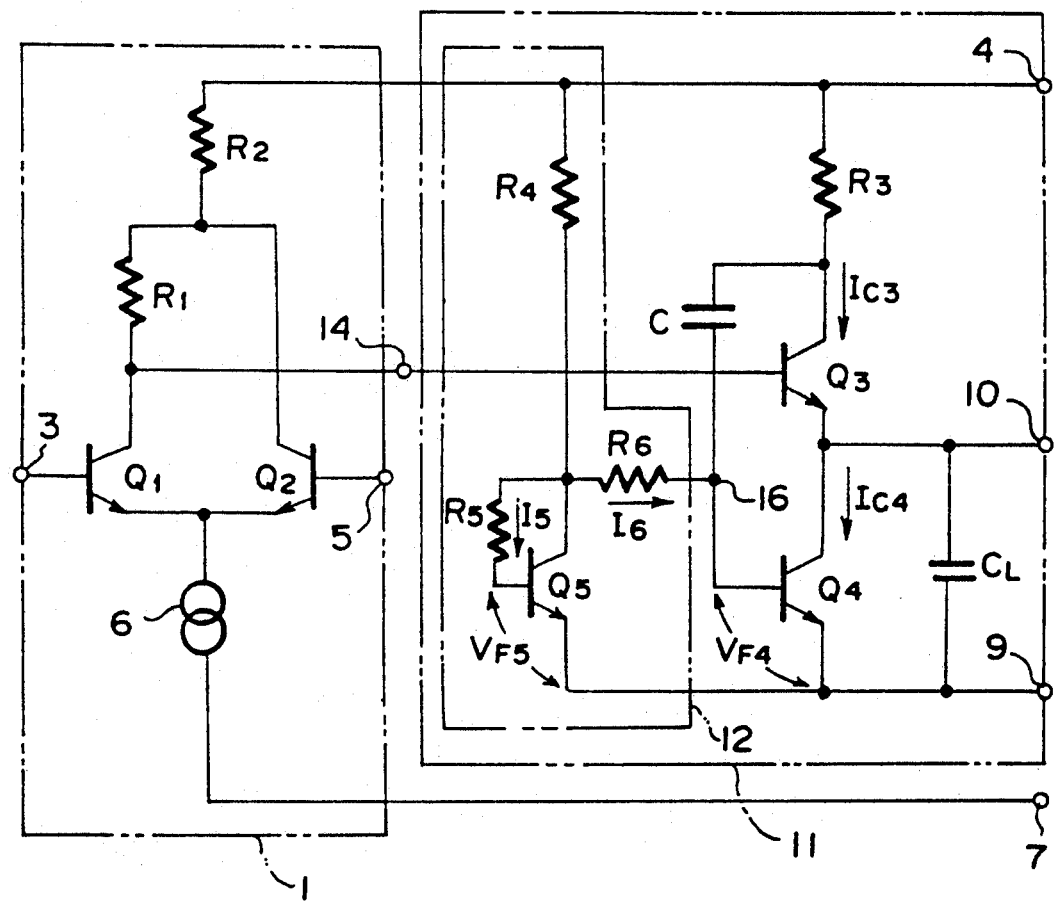
FIG. 2 is a circuit diagram showing the circuit configuration of a first embodiment of the present invention.

FIG. 2 is a circuit diagram showing the circuit configuration of a first embodiment of the present invention.

This embodiment operates as an inverter similarly to the conventional ECL circuit shown in FIG. 1.

This embodiment is constituted by a differential logic circuit 1 and an emitter follower output circuit 11 as shown in FIG. 2. The differential logic circuit 1 is the same as that of the conventional ECL circuit.

The emitter follower output circuit 11 is constituted by an output NPN bipolar transistor $Q_3$ having an emitter connected to an output terminal 10, an NPN bipolar transistor $Q_4$ having a collector connected to the emitter of the transistor $Q_3$, a base bias circuit 12 for controlling the base potential of the NPN bipolar transistor $Q_4$, and a capacitor C and a resistor $R_3$ which are provided for controlling the base potential of the NPN bipolar transistor $Q_4$.

The base bias circuit 12 controls the base potential of the NPN bipolar transistor $Q_4$ when an output signal is in a steady-state in a high level or in a low level.

On the other hand, the capacitor C and the resistor $R_3$ control the base potential of the NPN bipolar transistor $Q_4$ in a leading/trailing transition duration of the output signal.

In this embodiment, the collector of the output NPN bipolar transistor $Q_3$ is connected to a higher potential power supply terminal 4 through the resistor $R_3$.

Further, the NPN bipolar transistor $Q_4$ has a base connected to a collector of the output NPN bipolar transistor $Q_3$ through the capacitor C, and an emitter connected to a second lower potential power supply terminal 9. The base of the transistor $Q_4$ is also connected to an output of the base bias circuit 12.

The base bias circuit 12 is constituted by three resistors $R_4$, $R_5$ and $R_6$ and an NPN bipolar transistor $Q_5$.

The NPN bipolar transistor $Q_5$ has a collector connected to the higher potential power supply terminal 4 through the resistor $R_4$, an emitter connected directly to the second lower potential power supply terminal 9, and a base connected to the base of the NPN bipolar transistor $Q_4$ through the series connection of the resistors $R_5$ and $R_6$.

A connection point between the resistors $R_5$ and $R_6$ is connected to the collector of the NPN bipolar transistor $Q_5$.

Referring to the circuit diagram shown in FIG. 2 and the signal waveform diagrams shown in FIGS. 3A and 3B, the operation of this embodiment having the aforementioned configuration will be described hereunder.

First, assume that the signal outputted to the output terminal 10 is in the steady-state in a high level or in a low level.

In this case, a fixed potential is applied from the base bias circuit 12 to the base of the NPN bipolar transistor $Q_4$, so that a steady-state current is flowing into the collector of the NPN transistor $Q_4$.

The base-emitter forward voltage $V_{F4}$ of the NPN bipolar transistor $Q_4$ is expressed by the following equation:

$$V_{F4} = V_{F5} + R_5 \cdot I_5 - R_6 \cdot I_6 \qquad (1)$$

where $V_{F5}$ represents the forward voltage across the base-emitter circuit of the NPN bipolar transistor $Q_5$, and $I_5$ and $I_6$ represent the current values flowing into the resistors $R_5$ and $R_6$, respectively.

A collector current $I_{C4}$ expressed in the following equation (2) is made to flow steadily into the collector of the NPN bipolar transistor $Q_4$ by the above forward voltage $V_{F4}$.

$$I_{C4} = I_S \left\{ \exp\left(\frac{q}{kT} V_{F4}\right) - 1 \right\} \qquad (2)$$

where, $I_s$, q, k, and T represent a saturation current, a charge of an electron, a Boltzmann constant, and an absolute temperature, respectively.

Now, if the input signal applied to the input terminal 3 is in a low level, a high level signal is outputted to the output terminal 10.

At this time, the base-emitter forward voltage $V_{F4}$ of the NPN bipolar transistor $Q_4$ is given by the above equation (1), and the current $I_{C4}$ given by the above equation (2) is flowing into the collector of the NPN bipolar transistor $Q_4$, that is, the emitter of the NPN bipolar transistor $Q_3$.

Here, a steady-state current $I_{C3}$ shown in the following equation is flowing into the collector of the NPN bipolar transistor $Q_3$:

$$I_{C3} = \frac{\beta}{\beta + 1} \cdot I_{C4}$$

where $\beta$ represents a current amplification factor of the output NPN bipolar transistor $Q_3$.

Accordingly, the collector of the NPN bipolar transistor $Q_3$ has a potential level which is obtained by subtracting the voltage drop across the resistor $R_3$ due to the collector current $I_{C3}$ from the potential at the higher potential power supply terminal 4.

Here, in the state as described above, if the input signal applied to the input terminal 3 changes from low to high in its level, the path of the current flowing into a constant current source 6 is changed from the NPN bipolar transistor $Q_2$ to the NPN bipolar transistor $Q_1$.

As a result, the potential at the collector of the NPN bipolar transistor $Q_1$, that is, the potential at the base of the NPN bipolar transistor $Q_3$ goes down sharply.

However, the potential at the output terminal 10, that is, the potential at the emitter of the NPN bipolar transistor $Q_3$ goes down after the charge stored in the load capacitance $C_L$ is discharged, so that is cannot fall following the potential drop at the base of the NPN bipolar transistor $Q_3$ in the initial transition period.

Accordingly, the base-emitter forward voltage of the output NPN bipolar transistor $Q_3$ becomes lower than the value in the steady-state in the initial transition period of the level change of the input signal.

Also in the NPN bipolar transistor $Q_3$, the relation similar to the equation (2) is established between the collector current and the base-emitter voltage, so that the collector current of the transistor becomes lower than the current value in the steady-state described above.

Figure 3A:
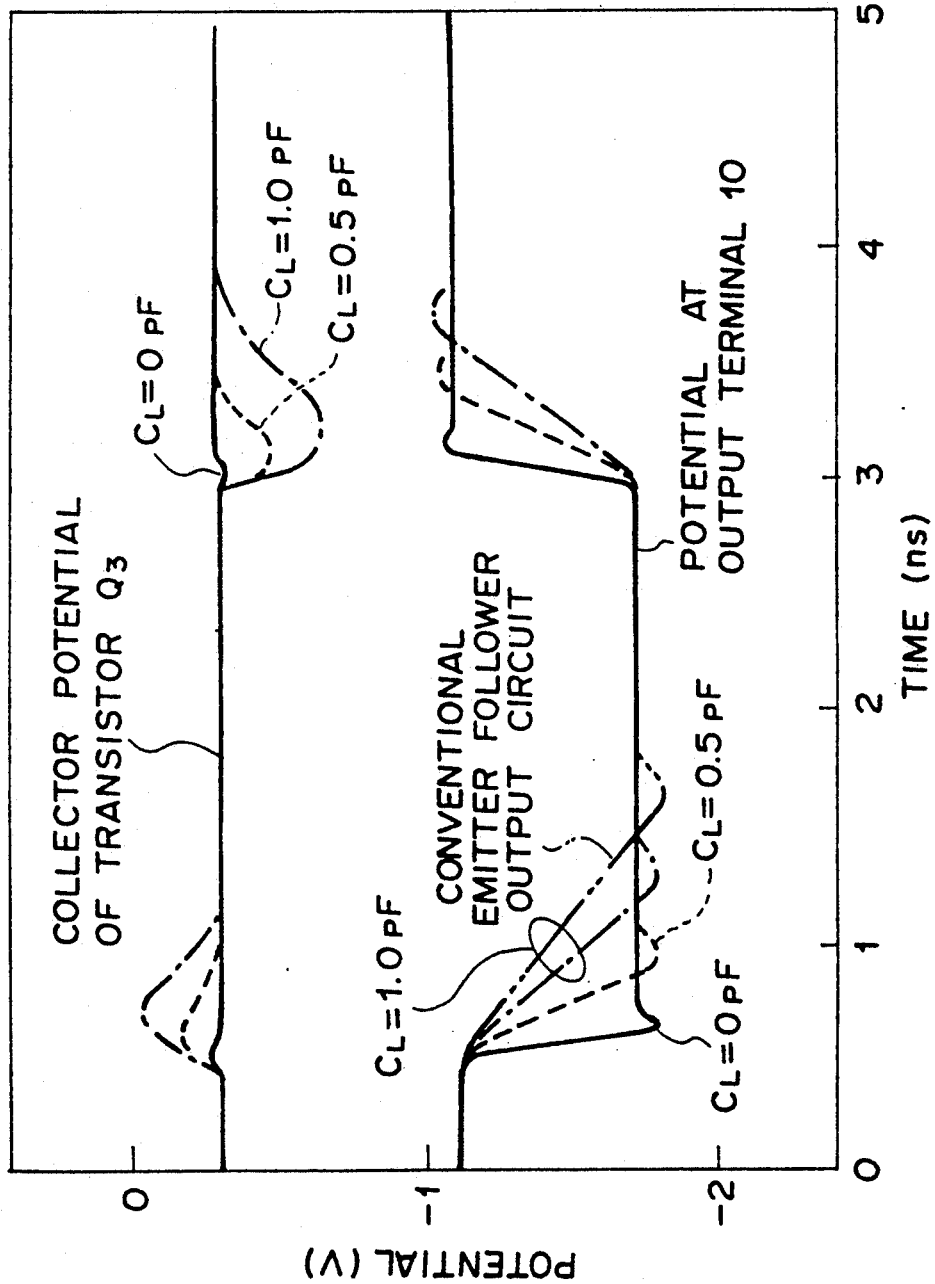

As a result, the potential at the collector of the output NPN bipolar transistor $Q_3$ rises as shown in FIG. 3A.

Then, in accordance with the rising of the potential at the collector of the NPN bipolar transistor $Q_3$, the potential at the base of the NPN bipolar transistor $Q_4$ rises transitionally. This is because the collector of the NPN bipolar transistor $Q_3$ is capacity-coupled with the base of the NPN bipolar transistor $Q_4$ through the capacitor C.

As a result, the base-emitter forward voltage $V_{F4}$ of the NPN transistor $Q_4$ becomes high so that the collector current thereof increases transitionally in accordance with the equation (2) as shown in FIG. 3B.

The transitional increase of the collector current of the NPN bipolar transistor $Q_4$ continues until the charge stored in the load capacitance $C_L$ is discharged. The degree of increase of the collector current becomes large correspondingly to the degree of the load capacitance $C_L$ as shown in FIG. 3B.

The charge of the load capacitance $C_L$ is discharged by the increased collector current described above, so that the potential at the output terminal 10 falls sharply as shown in FIG. 3A.

After the output signal at the output terminal 10 has fallen to a low level, the collector current of the NPN bipolar transistor $Q_4$ flows through the output NPN bipolar transistor $Q_3$, the potential at the base of the NPN bipolar transistor $Q_4$ returns to the constant potential given by the base bias circuit 12, and the potential at the collector of the NPN bipolar transistor $Q_3$ and the collector current of the NPN bipolar transistor $Q_4$ return to steady-state values as shown in FIGS. 3A and 3B, respectively.

Next, consideration is made on the case where the input signal applied to the input terminal 3 falls from a high level to a low level.

In this case, the current path of the constant current source 6 changes from the NPN bipolar transistor $Q_1$ to the NPN bipolar transistor $Q_2$, so that the potential at the collector of the NPN bipolar transistor $Q_1$, that is, the potential at the base of the output NPN bipolar transistor $Q_3$, rises sharply.

However, the potential at the output terminal 10, that is, the potential at the emitter of the output NPN bipolar transistor $Q_3$, rises after the load capacitance $C_L$ is charged, so that it cannot follow the base potential in the initial transitional period of the level change of the input signal. Accordingly, the voltage across the base-emitter circuit of the output NPN bipolar transistor $Q_3$ becomes high.

As a result, the collector current of the NPN bipolar transistor $Q_3$ increases transitionally so as to be larger than the value in the steady-state, so that the potential at the collector of the NPN bipolar transistor $Q_3$ falls transitionally as shown in FIG. 3A.

As the potential at the collector of the NPN bipolar transistor $Q_3$ falls, the potential at the base of the NPN bipolar transistor $Q_4$ also falls.

As a result, the collector current of the NPN bipolar transistor $Q_4$ decreases transitionally as shown in FIG. 3B, and the load capacitance $C_L$ is charged by the output NPN bipolar transistor $Q_3$, so that the potential at the output terminal 10 falls sharply.

In order to confirm the effects achieved by the present invention, the signal waveforms in operation were observed with the following values of the load capacitance $C_L$ in the embodiment:

$C_L = 0, 0.5,$ and $1.0 \, pF$.

FIGS. 3A and 3B show the results of the observation.

FIG. 3A is a diagram showing the waveforms of the respective potentials of the output signal and the collector of the NPN bipolar transistor $Q_3$ in operation.

FIG. 3B is a diagram showing the waveforms of the collector current of the NPN bipolar transistor $Q_4$ in the time zone corresponding to that in FIG. 3A.

Additionally, FIG. 3A shows a falling waveform of an output in the case where a current value of the constant current 8 was 0.4 mA and the load capacitance was 1.0 pF in the conventional emitter follower output circuit shown in FIG. 1.

The operation conditions of the embodiment are as follows.

(1) The potential at the higher potential power supply terminal: 0 V (2) The potential at the first lower potential power supply terminal: −4.5 V (3) The potential at the second lower potential power supply terminal: −3.3 V (4) The potential at the reference supply terminal: −1.4 V (5) The high level of the input/output signal: −1.1 V
The low level of the input/output signal: −1.7 V (6) The resistor $R_1$: 1.075 KΩ
The resistor $R_2$: 2.15 KΩ
The resistors $R_3$: 1.075 KΩ
The resistors $R_4$, $R_5$ and $R_6$: 8.3 KΩ

(7) The capacitor C: 0.1 pF

In FIG. 3A, when the falling waveform of the output signal of the embodiment and the falling waveform of the output signal of the conventional emitter follower output circuit are compared with each other in the case of the load capacitance $C_L$ of 1.0 pF, it can be readily understood that the output signal waveform of this embodiment falls more sharply than that in the conventional one, thereby showing the advantageous effects of the present invention.

Further, in this embodiment, when the load capacitance $C_L$ is changed, the collector current of the NPN bipolar transistor $Q_4$ changes correspondingly to the degree of the load capacitance as shown in FIG. 3B, so that the falling time of the output signal is improved independently of the degree of the load capacitance. Thus, the advantageous effects of the present invention was confirmed.

Next, a second embodiment of the present invention will be described hereunder.

Figure 4:
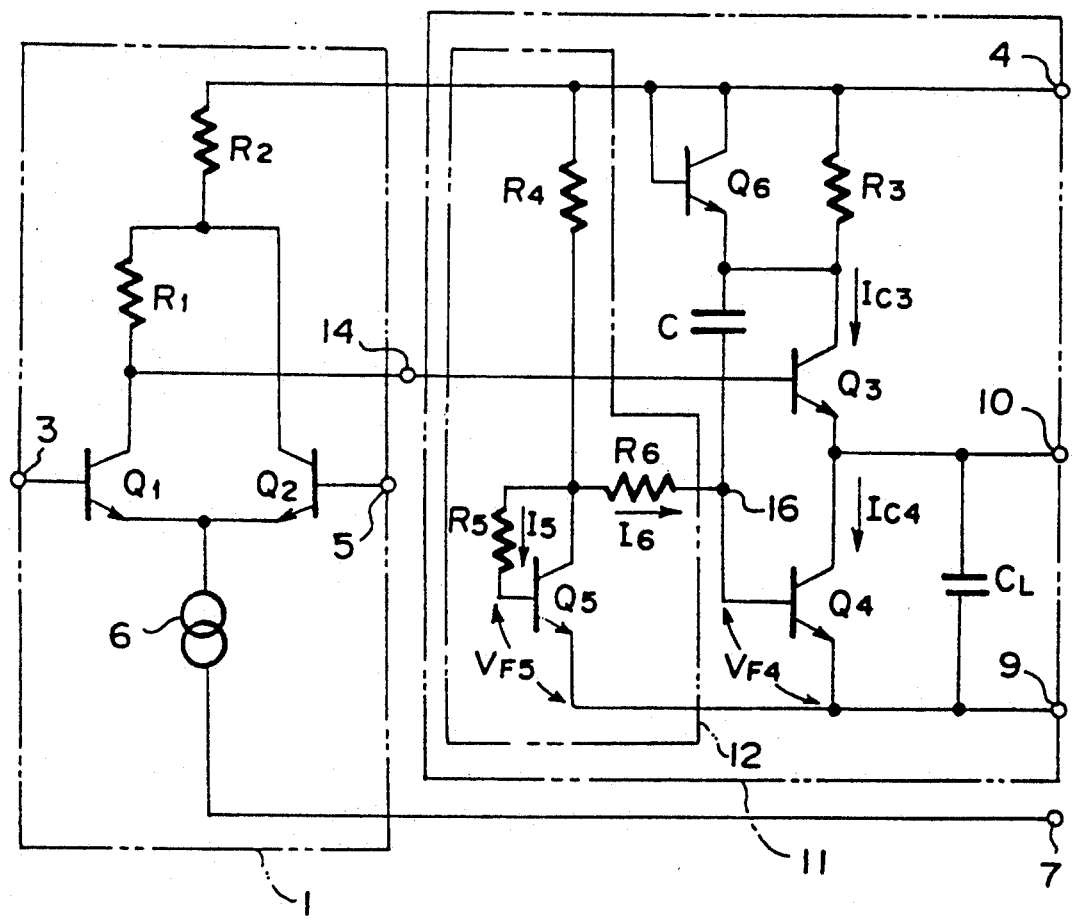
FIG. 4 is a circuit diagram showing the circuit configuration of a second embodiment of the present invention.

FIG. 4 is a circuit diagram showing the circuit configuration of the second embodiment of the present invention.

The difference between the second embodiment and the first embodiment shown in FIG. 2 is in that an NPN bipolar transistor $Q_6$ is provided between the collector of the output NPN bipolar transistor $Q_3$ and the higher potential power supply terminal 4 in the second embodiment.

The transistor $Q_6$ has a collector and a base which are commonly connected to the higher potential power supply terminal 4, and an emitter connected to the collector of the output NPN bipolar transistor $Q_3$.

This second embodiment achieves not only the effect common to the first embodiment but also the following effect.

In the case where the load capacitance $C_L$ is particularly large, the collector current of the NPN bipolar transistor $Q_3$, which flows transitionally when the potential of the output terminal 10 goes up, becomes too large.

Accordingly, the potential at the collector of the NPN bipolar transistor $Q_3$ becomes so low that the transistor $Q_3$ is saturated, or it takes a long time until the collector current of the transistor $Q_3$ returns to a steady-state value so that the high-speed property according to the present invention deteriorates.

If the NPN bipolar transistor $Q_6$ is provided as in this embodiment, the potential at the collector of the output NPN bipolar transistor $Q_3$ can be clamped, so that the high-speed property can be prevented from deteriorating. Accordingly, the range of application of the present invention can be further widened.

Although the description has been made by use of a differential logic circuit constituted by a pair of differential transistors as the logic circuit provided in the stage before the emitter follower output circuit so as to perform logic operation in the first and second embodiments, it is apparent that the present invention is not limited to the differential logic circuit and can be applied to a logic circuit of any other circuit configuration.

Further, although generally widely used circuits have been used as the base bias circuit and the collector potential clamp circuit, it is apparent that the advantageous use of the present invention is not limited to those circuits.

As described above, according to the present invention, the current flowing into the emitter follower output circuit is made small independently of the potential level of the output terminal in the steady-states; the current is made large transitionally and correspondingly to the degree of the load capacitance so as to discharge the load capacitance rapidly in the falling period of the output signal; and the current is made small transitionally so as to charge the load capacitance rapidly by use of the output transistor, whereby it is possible to provide an emitter follower output circuit which consumes little power and which operates at a high speed.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An emitter follower output circuit comprising:
   a higher potential and a lower potential power supply terminal;
   a first bipolar transistor having a collector coupled to said higher potential power supply terminal, and an emitter, said first bipolar transistor feeding a potential from said emitter to an output terminal;
   a second bipolar transistor which is connected in series between said first bipolar transistor and said lower potential power supply terminal and which feeds a current to said first bipolar transistor; and
   a control means which is connected between a collector of said first bipolar transistor and a base of said second bipolar transistor, which detects a transitional change of a potential at the collector of said first bipolar transistor and which controls a potential at the base of said second bipolar transistor;
   whereby a current flowing into said second bipolar transistor becomes transitionally larger than a current value in a steady-state when an output signal falls, and becomes transitionally smaller than the current value in said steady-state when said output signal rises.

2. An emitter follower output circuit comprising:
   a first NPN bipolar transistor having a base connected to a signal input terminal, a collector connected to a higher potential power supply terminal through a resistor, and an emitter connected to an output terminal;
   a second NPN bipolar transistor having a collector connected to said output terminal, and an emitter connected to a lower potential power supply terminal, the collector of said first NPN bipolar transistor being capacity-coupled with a base of said second NPN bipolar transistor; and
   a base bias circuit having an output node connected to the base of said second NPN bipolar transistor, wherein said base bias circuit comprises:
   a third NPN bipolar transistor having a collector connected to said higher potential power supply terminal through a first resistor, and an emitter connected to said lower potential power supply terminal;
   a second resistor connected between said collector and a base of said third NPN bipolar transistor; and
   a third resistor having one end connected to said collector of said third NPN bipolar transistor and the other end connected to the base of said second NPN bipolar transistor.

3. An emitter follower output circuit comprising:
   a first NPN bipolar transistor having a base connected to a signal input terminal, a collector connected to a higher potential power supply terminal through a first resistor, and an emitter connected to an output terminal;
   a second NPN bipolar transistor having a base, a collector connected to said output terminal, and an emitter connected to a lower potential power supply terminal, the collector of said first NPN bipolar transistor being capacity-coupled with the base of said second NPN bipolar transistor;

a base bias circuit formed by a third NPN bipolar transistor, said third NPN bipolar transistor having a base, a collector connected to said higher potential power supply terminal through a second resistor, and an emitter connected to said lower potential power supply terminal, a third resistor connected between said collector and the base of said third NPN bipolar transistor, and a fourth resistor having one end connected to said collector of said third NPN bipolar transistor and the other end connected to the base of said second NPN bipolar transistor; and a collector-potential clamp circuit provided between the collector of said first NPN bipolar transistor and said higher potential power supply terminal.

4. An emitter follower output circuit according to claim 3 in which said collector-potential clamp circuit comprises a fourth NPN bipolar transistor having a collector and a base commonly connected to said higher potential power supply terminal, and an emitter connected to the collector of said first NPN bipolar transistor.

* * * * *